(12) United States Patent
Albers et al.

(10) Patent No.: US 7,994,857 B2
(45) Date of Patent: Aug. 9, 2011

(54) DYNAMIC CONSTANT POWER AMPLIFIER

(75) Inventors: Mark D. Albers, Mesa, AZ (US); James C. Strickland, Mesa, AZ (US); David Dean Baker, Gilbert, AZ (US)

(73) Assignee: Rockford Corporation, Tempe, AZ (US)

( * ) Notice: Subject to any disclaimer, the term of this patent is extended or adjusted under 35 U.S.C. 154(b) by 0 days.

(21) Appl. No.: 12/645,996

(22) Filed: Dec. 23, 2009

(65) Prior Publication Data

US 2011/0148521 A1 Jun. 23, 2011

(51) Int. Cl.
*H03F 3/217* (2006.01)

(52) U.S. Cl. .................... 330/251; 330/207 A

(58) Field of Classification Search .............. 330/10, 330/207 A, 251
See application file for complete search history.

(56) References Cited

U.S. PATENT DOCUMENTS

| | | |
|---|---|---|
| 4,146,847 A | 3/1979 | Otao et al. |
| 4,727,874 A | 3/1988 | Bowers et al. |
| 5,532,649 A | 7/1996 | Sahyoun |
| 5,719,526 A | 2/1998 | Fink |
| 7,268,621 B2 * | 9/2007 | Kanoh et al. ............ 330/251 |
| 7,276,964 B2 | 10/2007 | Ishikawa |
| 7,288,991 B2 | 10/2007 | Ripley |
| 7,436,967 B2 | 10/2008 | Neunaber |
| 7,554,409 B1 * | 6/2009 | Zhang et al. ............ 330/251 |
| 7,705,673 B2 * | 4/2010 | Teng et al. ............ 330/251 |
| 2004/0258257 A1 | 12/2004 | Hupp |

* cited by examiner

*Primary Examiner* — Khanh V Nguyen
(74) *Attorney, Agent, or Firm* — Steptoe & Johnson LLP

(57) ABSTRACT

A switching amplifier including a voltage sensor circuit connected to a high voltage supply rail for measuring the power supply voltage. A current sensor circuit is connected to the high voltage supply rail for measuring the power supply current. An error amplifier is connected to the switching amplifier and receives one or more values based on the measurements taken by the voltage sensor and current sensor, and the error amplifier produces an error signal when a predetermined power limit is exceeded. A signal limiting circuit is connected to the error amplifier and the switching amplifier and limits the output power to rated power at any rated load impedance when the error amplifier produces the error signal. This switching amplifier is capable of automatically limiting output power at rated power into all rated load impedances, and dynamically reacts to the frequency-dependant impedance of a typical audio system.

41 Claims, 14 Drawing Sheets

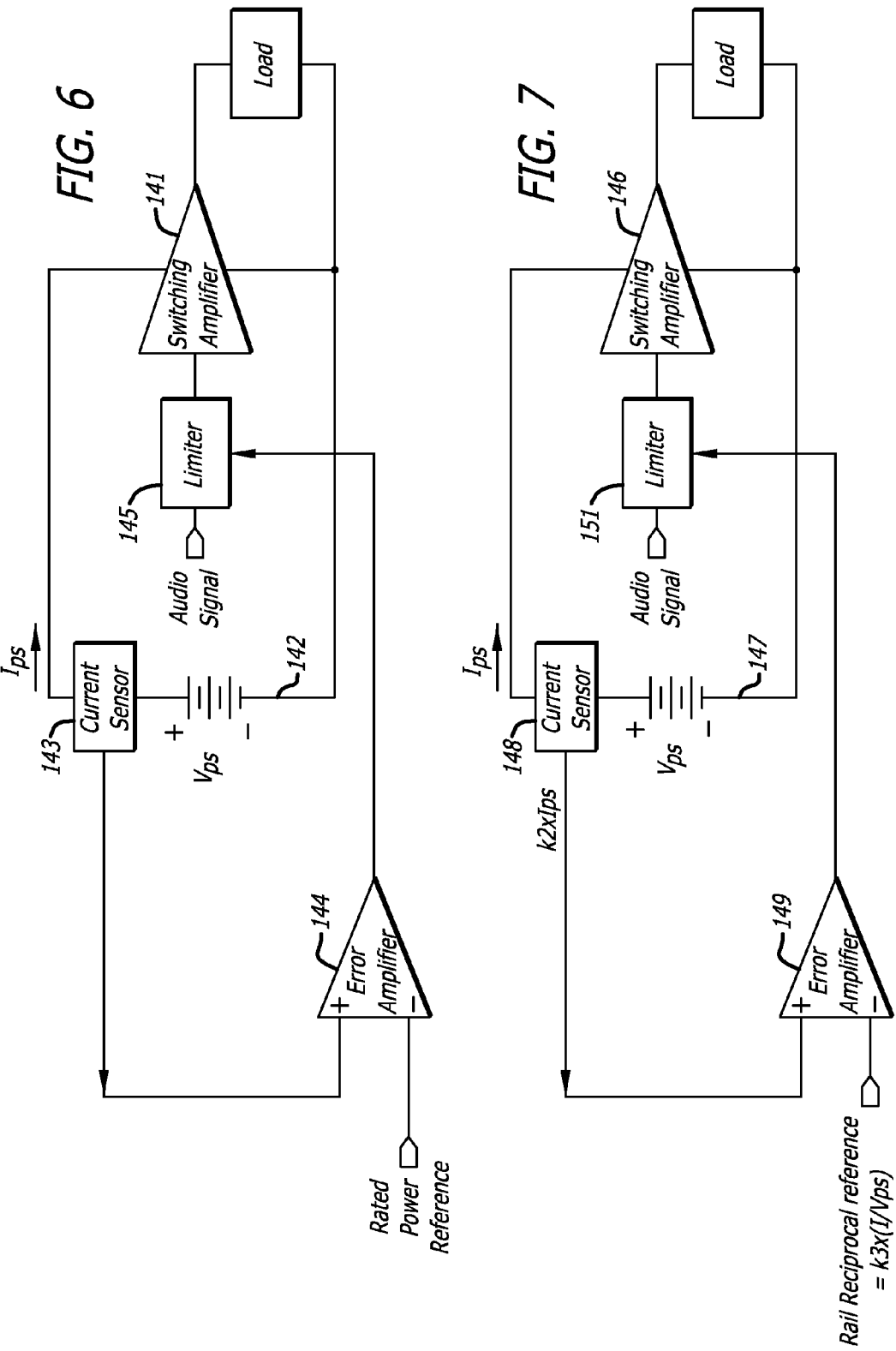

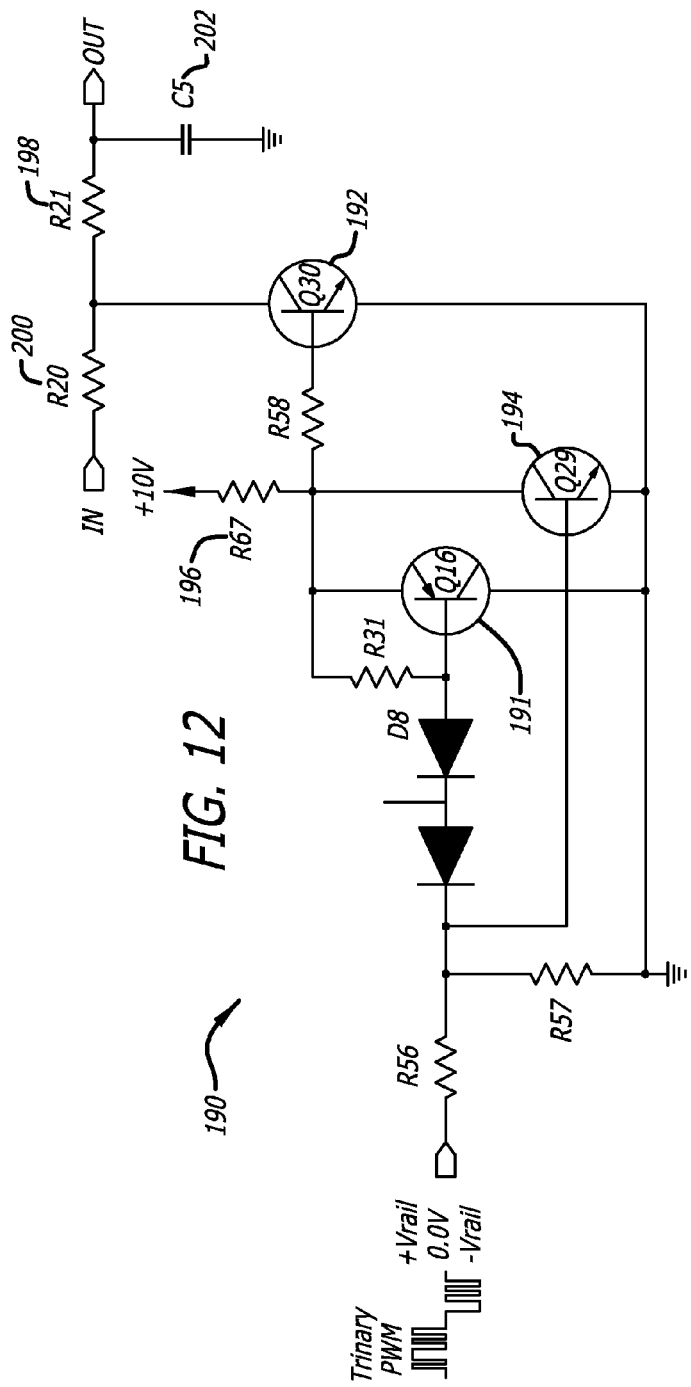
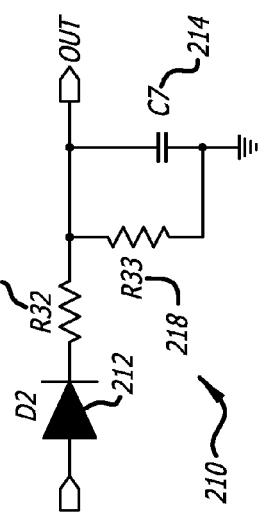
FIG. 12
FIG. 13

DYNAMIC CONSTANT POWER AMPLIFIER

FIELD

Embodiments disclosed herein relate generally to the field of amplifiers, and more specifically to audio power amplifiers and protection systems for limiting power dissipation in power stages and loads.

BACKGROUND

Amplifiers are devices that accept a varying input signal and produce an output signal that varies in the same way as the input, but with larger amplitude. The input and output signals may consist of a current, a voltage, a mechanical motion, or any other signal. An electronic amplifier is a device for increasing the power of a signal. It does this by taking power from a power supply and shaping the output to match the input signal. This process invariably introduces some noise and distortion into the signal, and the process is not completely efficient. Amplifiers always produce some waste as heat.

Different designs of amplifiers are used for different types of applications and signals. Amplifiers broadly fall into three categories: small signal amplifiers, low frequency power amplifiers, and RF power amplifiers. The most common types of amplifiers are electronic and have transistors or electron tubes as their principal components. Electronic amplifiers are widely used in consumer electronic devices, such as in radio and television transmitters and receivers, as well as audio and stereo systems.

In general, commercial audio power amplifiers are valued according to their power rating into various load impedances. Whether the sound system is in a stadium, nightclub, or a maximum sound pressure level ("SPL") automotive competition, value is measured in SPL, and more SPL requires more power. Conventional amplifier technology will produce the highest power rating into a single rated load impedance only, which is the lowest impedance. At higher load impedances, the power rating decreases. When selecting a power amplifier for a set of speakers, a system designer will typically choose an amplifier that has sufficient power at the speakers' nominal impedance, which is also normally the speakers' lowest impedance. Considering the wide variation of impedance with frequency commonly seen in individual speakers and loudspeaker systems, it is not unusual to find that the conventional amplifier can only deliver maximum rated power over a narrow range of frequencies surrounding the lowest point in the speaker impedance curve, which is the nominal impedance.

There have been a few examples of commercially available amplifiers that use manual or automatic means to deliver rated power over a range of rated nominal speaker impedances. One example of these quasi-constant power amplifiers is a single-ended triode vacuum-tube power amplifier that incorporated a step-down transformer in the output stage to impedance match the high voltage output of the tubes to the relatively low impedance of speakers. In order to deliver rated power into a variety of nominal impedances, typically between 8Ω to 16Ω, the output transformer had a choice of "taps" where different step-down winding ratios could be selected to match the output voltage of the vacuum tubes to the exact voltage that would produce rated power into the desired speaker impedance.

Other examples of manually corrected quasi-constant power amplifiers employed a panel-mounted "impedance switch" where the user could indicate a 2Ω, 4Ω, or 8Ω nominal impedance speaker was being used. The amplifier would then adjust its internal switch-mode-power-supply to the correct voltage, such that the output stage will be limited to a voltage that will produce no more than rated power at the user-specified nominal impedance. In other variations of this type of quasi-constant power amplifier, the "impedance switch" is automated by internal circuits that measure the nominal or minimum speaker impedance.

These quasi-constant power amplifiers represented improvements in the amplifier-speaker matching process by giving the user a versatile amplifier that could be set up manually or automatically to a single discrete choice that would deliver maximum rated power at the lowest expected or nominal load impedance. However, none of these amplifiers can react to a dynamically changing load impedance, such as a complex loudspeaker load driven with music and automatically limit at rated power over the range of rated impedances. These quasi-constant power amplifiers were optimized for one impedance only, which was the nominal impedance, so the conventional amplifier problem of only achieving rated power over the narrow range of frequencies surrounding the nominal impedance was not solved.

Accordingly, what is needed is a new power amplifier that delivers maximum rated power into all rated impedances.

SUMMARY

Briefly, and in general terms, there is disclosed a dynamically constant power system having a switching amplifier device with an input for receiving an audio input signal and an output to a load, and the switching amplifier also has at least one high voltage supply rail. The switching amplifier also includes a voltage sensor circuit that is connected to the high voltage supply rail and the voltage sensor circuit measures the power supply voltage of the switching amplifier. A current sensor circuit is connected to the high voltage supply rail and the current sensor circuit measures the power supply current of the switching amplifier. There is also an error amplifier connected to the switching amplifier that receives a value based on the measurements taken by the voltage sensor and current sensor and produces an error signal when a predetermined power limit is exceeded. A signal limiting circuit connected to the error amplifier and the switching amplifier limits the output power to rated power at any rated load impedance when the error amplifier produces the error signal. Therefore, the switching amplifier device is capable of automatically limiting output power at rated power into all rated load impedances, and dynamically reacting to the frequency-dependant impedance of a typical audio system. The dynamic constant power system reacts dynamically to increasing and decreasing load impedances and has unlimited resolution. Also, the reaction time of the dynamic constant power system may be nearly instantaneous.

In one embodiment, the switching amplifier device may also include a power calculator connected between the error amplifier and the voltage and current sensor circuits. The power calculator multiplies the power supply voltage and power supply current together to calculate a scaled value of a power supply power. The error amplifier compares the value of the power supply power supplied by the power calculator to a scaled reference representing a rated power, and the error amplifier produces the error signal when the value of the power supply power exceeds the scaled reference representing the rated power.

In another embodiment, the switching amplifier device may include a reciprocal calculator connected between the error amplifier and the voltage current sensor. The reciprocal calculator produces a scaled reciprocal value of the power supply voltage. In this embodiment, the current sensor circuit produces a scaled value of the power supply current and the current sensor circuit is connected directly to the error amplifier. The error amplifier compares the scaled reciprocal value of the power supply voltage from the reciprocal calculator to the scaled value of the power supply current from the current sensor circuit, and the error amplifier produces the error signal when the scaled value of the power supply current exceeds the scaled reciprocal value of the power supply voltage.

In different embodiments, the switching amplifier may be a two-wire Class BD amplifier, a single-wire Class BD amplifier or a Class AD amplifier. Further, the current sensor circuit of the switching amplifier may be a differential amplifier that measures the voltage across a low-impedance sense resistor of the switching amplifier. It is also possible that the current sensor circuit is a single-ended amplifier that measures a voltage drop across a ground-referenced sense resistor of the switching amplifier. In yet another embodiment, the current sensor circuit of the switching amplifier may be a chopper circuit that measures the voltage across a sense resistor of the switching amplifier. If the switching amplifier is a single wire Class BD amplifier, its trinary output voltage drives the chopper circuit.

The voltage sensor circuit of the switching amplifier device may be a resistor divider that measures the voltage directly at a positive terminal of the high voltage supply rail of the switching amplifier. In another embodiment, the voltage sensor circuit of the switching amplifier may be a peak hold circuit that measures the voltage of the high voltage supply rail.

If the switching amplifier is a Class AD amplifier, the Class AD amplifier has a first high voltage supply rail connected to a first sense resistor and a second high voltage supply rail connected to a second sense resistor. In this embodiment, the current sense circuit sums the currents at the first and second high voltage supply rails measured at the first and second sense resistors. Further, the voltage sense circuit sums the power supply voltage of the first and second high voltage supply rails.

There is also disclosed a method for delivering rated power into all rated load impedances of a switching amplifier. The method includes measuring a power supply voltage of the switching amplifier with a voltage sensor circuit connected to a high voltage supply rail of the switching amplifier. A power supply current of the switching amplifier is also measured with a current sensor circuit connected to the high voltage supply rail of the switching amplifier. The method also includes calculating a value of a power supply power with a power calculator connected between the error amplifier and the voltage and current sensor circuits by multiplying the power supply voltage and power supply current together. An error amplifier then compares the value of the power supply power to a scaled reference representing a rated power connected to the switching amplifier and the power calculator. An error signal is produced from the error amplifier when the value of the power supply power exceeds the scaled reference representing the rated power. The method further includes limiting an output power of the switching amplifier to a rated power at any rated load impedance with a signal limiting circuit connected to the switching amplifier and the error amplifier when the error amplifier produces the error signal.

This method automatically limits output power of the switching amplifier at rated power into all rated load impedances, and dynamically reacts to the frequency-dependant impedance of a typical audio system. The switching amplifier for this method may be a two-wire Class BD amplifier, a single-wire Class BD amplifier or a Class AD amplifier.

Another embodiment of a method for delivering rated power into all rated load impedances of a switching amplifier is also disclosed. This method includes measuring a power supply voltage of the switching amplifier with a voltage sensor circuit connected to a high voltage supply rail of the switching amplifier. A scaled reciprocal value of the power supply voltage is produced with a reciprocal calculator connected to the voltage sensor circuit. The method also includes measuring a power supply current of the switching amplifier with a current sensor circuit connected to the high voltage supply rail of the switching amplifier. The current sensor circuit also produces a scaled value of the power supply current. Also, the scaled reciprocal value of the power supply voltage from the reciprocal calculator is compared to the scaled value of the power supply current from the current sensor circuit with an error amplifier. The error amplifier is connected to the reciprocal calculator and the current sensor. An error signal is produced from the error amplifier when scaled value of the power supply current exceeds the scaled reciprocal value of the power supply voltage. The method further includes limiting an output power of the switching amplifier to a rated power at any rated load impedance with a signal limiting circuit connected to the switching amplifier and the error amplifier when the error amplifier produces the error signal.

Also, another embodiment of an amplifier device is disclosed. The amplifier device includes a switching amplifier including an input for receiving an audio input signal and an output to a load. Further, the switching amplifier includes a regulated high-voltage supply rail. There is a current sensor circuit connected to the regulated high-voltage supply rail and the current sensor circuit measures the power supply current of the switching amplifier. An error amplifier connected to the switching amplifier receives a value based on the measurement taken by the current sensor and produces an error signal when a predetermined power limit is exceeded. The device also includes a signal limiting circuit connected to the error amplifier and the switching amplifier, and the signal limiting circuit limits the output power to rated power at any rated load impedance when the error amplifier produces the error signal. The amplifier device is capable of automatically limiting output power at rated power into all rated load impedances, and dynamically reacting to the frequency-dependant impedance of a typical audio system.

The error amplifier compares the value based on the measurement taken by the current sensor to a rated power reference and the error amplifier produces the error signal when the value based on the measurement taken by the current sensor exceeds the scaled reference representing the rated power. In another embodiment, the error amplifier compares a scaled value of the power supply current from the current sensor to a rail reciprocal reference, and the error amplifier produces the error signal when the scaled value of the power supply current exceeds the rail reciprocal reference.

Other features and advantages will become apparent from the following detailed description, taken in conjunction with the accompanying drawings, which illustrate by way of example, the features of the various embodiments.

BRIEF DESCRIPTION OF THE DRAWING

FIG. 6 depicts a diagram of an embodiment of a switching amplifier that includes a dynamic constant power feature and includes a fixed or regulated high-voltage supply;

FIG. 7 depicts a diagram of yet another embodiment of a switching amplifier that includes a dynamic constant power feature and includes a fixed or regulated high-voltage supply;

FIG. 12 depicts another embodiment of a chopper circuit used to acquire a scaled measurement of the power supply current of the single-wire Class BD amplifier;

FIG. 13 depicts one embodiment of a peak hold circuit used to measure and scale the power supply voltage of the single-wire Class BD amplifier;

DETAILED DESCRIPTION

Figure 1:
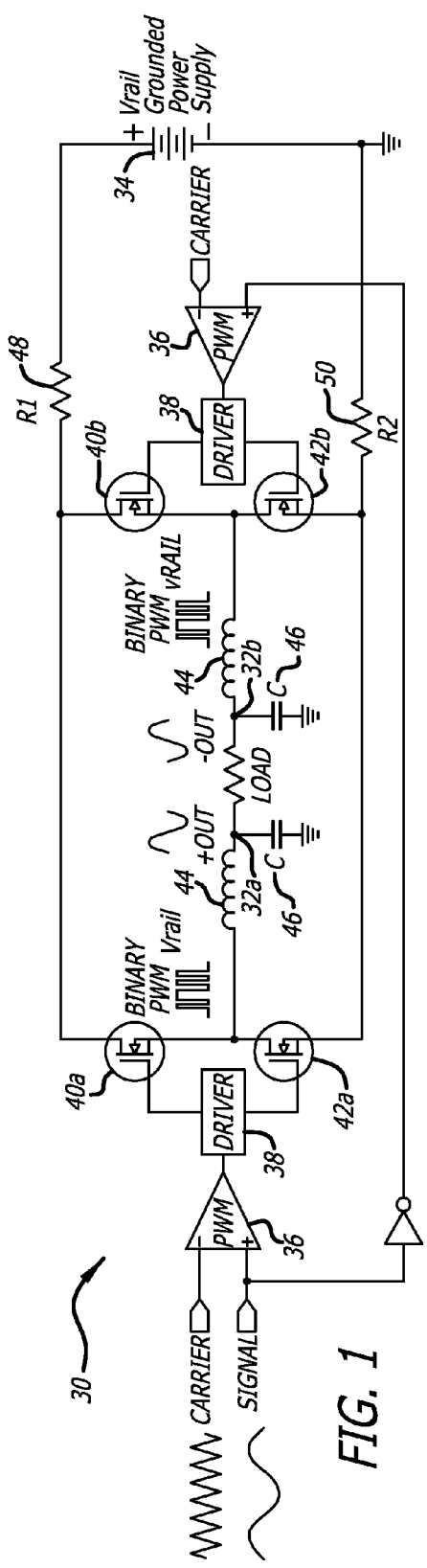
FIG. 1 depicts a two-wire Class BD amplifier.

The various embodiments described below are provided by way of illustration only and should not be construed to limit the claimed invention. Those skilled in the art will readily recognize various modifications and changes that may be made to the disclosed embodiments without departing from the scope of the claimed invention. By way of non-limiting example, it will be appreciated by those skilled in the art that particular features or characteristics described in reference to one figure or embodiment may be combined as suitable with features or characteristics described in another figure or embodiment. Further, those skilled in the art will recognize that the devices, systems, and methods disclosed herein are not limited to one field.

Referring now to the drawings, wherein like reference numerals denote like or corresponding parts throughout the drawings, embodiments of a power control system are described and shown that limit the power delivered to a high-efficiency switching audio power amplifier stage. The power delivered to the amplifier stage is measured and limited through various means of input signal amplitude limiting. By limiting the power delivered to the amplifier below a fixed constant, the control system protects the amplifier from excessive power dissipation and temperature rise, and allows the output signal to be limited at a constant rated power level over a range of rated load impedances. The measured amount of power delivered to the high-efficiency switching audio power amplifier stage represents a good estimate of the power delivered to the load. This is due to the unique properties of Class AD and Class BD switching amplifiers that allow them to deliver power efficiently at any output voltage and current within the limits of an operating range of the circuit components. Limiting this measured power to a constant produces reasonably accurate limiting of the load power dissipation, resulting in near-constant power over a range of rated load impedance.

One embodiment of the dynamic constant power system and method automatically limits the output power at rated power into all rated load impedances, and dynamically reacts to the frequency-dependant impedance of a typical loudspeaker system. The dynamic constant power system reacts dynamically to increasing and decreasing load impedances and has unlimited resolution. The reaction time of the dynamic constant power system may be nearly instantaneous. The dynamic constant power system and method applies to switching amplifier topologies and exploits the unique relationship between the amplifier output power and the power supply power. In this embodiment, the benefits of delivering dynamic constant power into all rated load impedances is achieved without degrading the highly desirable power efficiency of the switching power amplifier.

Dynamic constant power can be delivered to a two-wire Class BD amplifier 30 as shown in FIG. 1. The two-wire Class BD amplifier 30 includes a full-bridge output with two floating speaker connections 32a and 32b and a single grounded high-voltage supply (Vrail) 34. In amplifier 30 shown in FIG. 1, each half-bridge of the full-bridge includes a pulse-width-modulating amplifier 36 and driver 38 that are connected to high side MOSFETs 40a and 40b and low side MOSFETs 42a and 42b. As indicated in FIG. 1, amplifier 30 produces a binary pulse width modulation (PWM) equivalent of the analog input signal which is fed to the load via a filter network to block the carrier and recover the original audio. The output filter is an LC circuit formed by an inductor 44 and capacitor 46. The output of amplifier 30 is coupled to the two floating speaker connections. Also, the single grounded high-voltage supply (Vrail) 34 is connected to a first resistor 48 and a second resistor 50.

Figure 2:
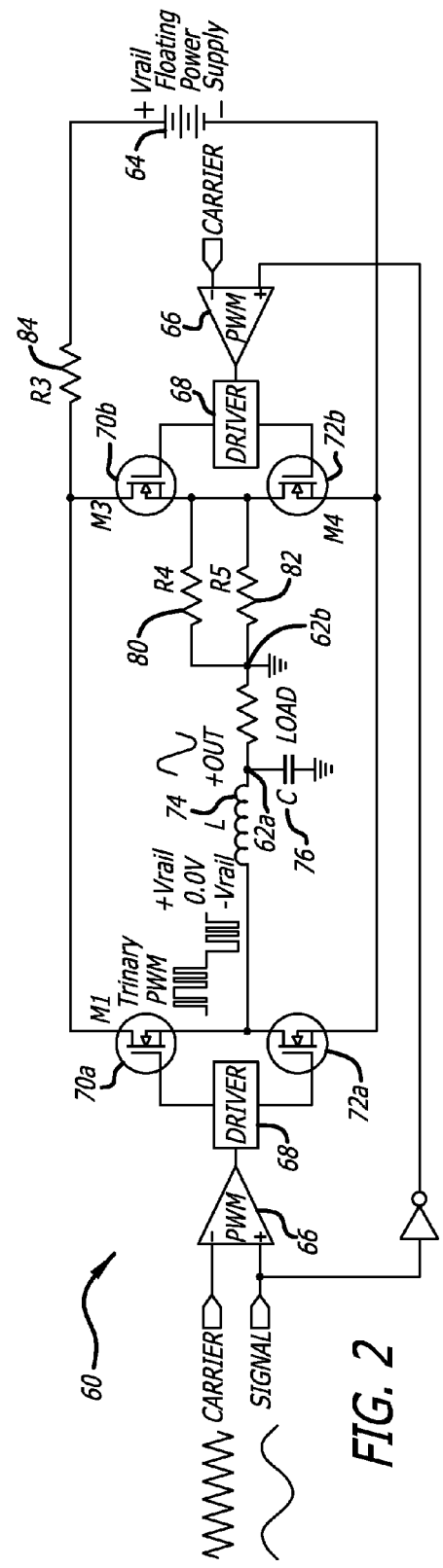
FIG. 2 depicts a single-wire Class BD amplifier.

A single-wire Class BD amplifier 60 is shown in FIG. 2 and includes a full-bridge output with a single floating speaker wire 62a, a grounded speaker wire 62b, and a single floating high-voltage supply (Vrail) 64. In amplifier 60 shown in FIG. 2, each half-bridge of the full-bridge includes a pulse-width-modulating amplifier 66 and driver 68 that are connected to high side MOSFETs 70a and 70b and low side MOSFETs 72a and 72b. As indicated in FIG. 2, amplifier 60 produces a trinary pulse width modulation (PWM) equivalent to the analog input signal which is fed to the load via a filter network to block the carrier and recover the original audio. The output filter is an LC circuit formed by an inductor 74 and capacitor 76. As shown in FIG. 2, one half bridge includes a short connection 78 between the high side MOSFET 70*b* and the low side MOSFET 72*b* that is connected to resistor 80 and resistor 82. The output of amplifier 60 is coupled to the floating speaker wire and the grounded speaker wire. Also, the single floating high-voltage supply (Vrail) 64 is connected to resistor 84.

An example of a single-wire Class BD amplifier is shown and described in U.S. Pat. No. RE40,550, titled "Method and Device for Improved Class BD Amplification having Single-Terminal Alternating-Rail Dual-Sampling Topology," which is hereby incorporated by reference in its entirety. The dynamic constant power system can be implemented on the single-wire Class BD amplifier shown in U.S. Pat. No. RE40,550.

Figure 3:
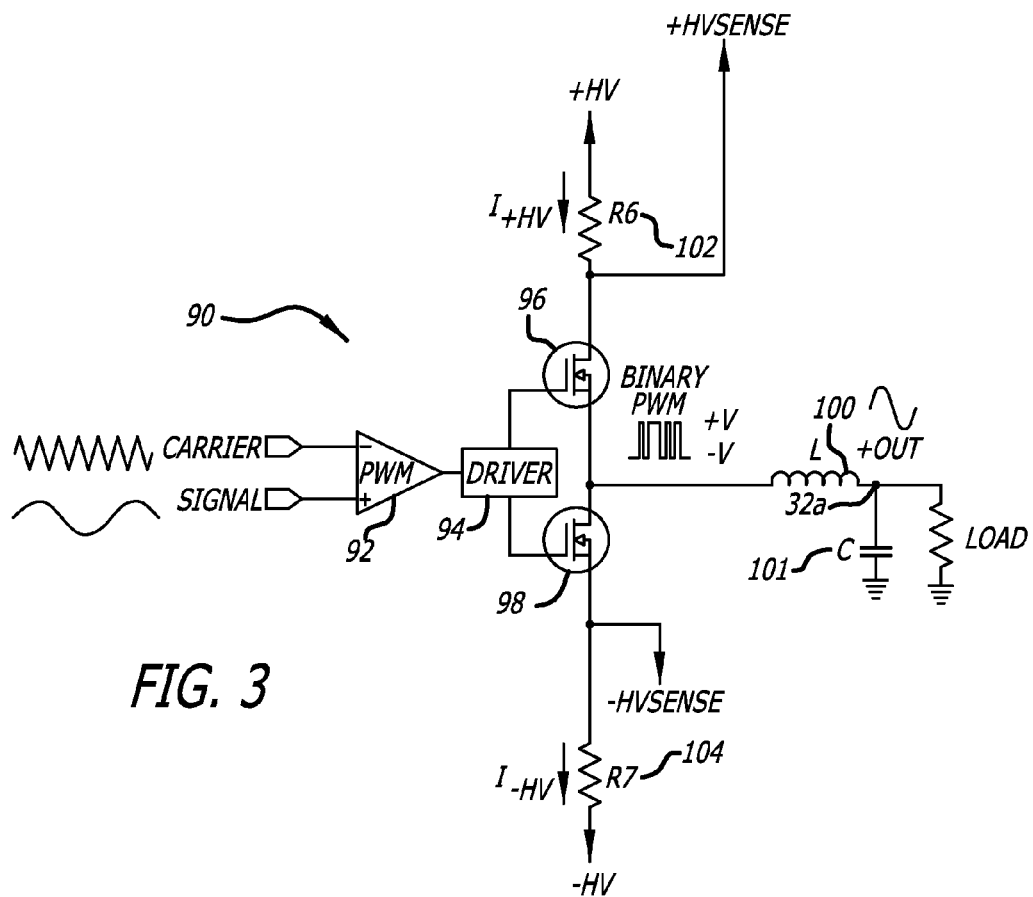
FIG. 3 depicts a Class AD amplifier.

Referring now to FIG. 3, a Class AD amplifier 90 (popularly known as "Class D") is shown with a half-bridge and two grounded high-voltage supplies +HV and −HV. In amplifier 90 shown in FIG. 3, the half-bridge includes a pulse-width-modulating amplifier 92 and driver 94 that are connected to a high side MOSFET 96 and a low side MOSFET 98. As indicated in FIG. 3, amplifier 90 produces a binary pulse width modulation (PWM) equivalent of the analog input signal which is fed to the load via a filter network to block the carrier and recover the original audio. The output filter is an LC circuit formed by an inductor 100 and capacitor 101. Also, the grounded high-voltage supply +HV is connected to a first sense resistor 102 and the grounded high-voltage supply −HV is connected to a second sense resistor 104.

A variety of circuit implementations will be shown for each switching amplifier topology 30, 60 and 90 that will measure power supply voltage ("V") and current ("I"). However, once all these measurements have been reduced to scaled signals representing power supply voltage and current, all three switching amplifier topologies 30, 60 and 90 shown in FIGS. 1-3 will share identical waveforms. It has also been contemplated that the dynamic constant power feature described herein can be applied to all types of pulse mode amplifiers, including fixed carrier pulse width modulation, self-oscillating pulse width modulation, and pulse density modulation.

The unique and useful relationship between output power and power supply power that all these switching amplifier topologies share is related to their power efficiency. In theory the Class AD and Class BD are 100% efficient, but examples of commercially available switching amplifiers rated in the 85% to 95% efficiency range are common. The power losses in switching amplifiers are generally due to the series resistance of the output devices, V*I losses from the voltage slew-rate limit of the output devices, reverse-recovery losses, and AC and I$^2$R inductor losses. A practical and reasonably accurate equation of these losses can be formed with the following equation:

$$Pout = k1 * Pps$$

In this above equation, Pout is the output power to the load, Pps is the power supply power into the amplifier stage, and k1 is the efficiency. This equation represents the measurement of the power supply power as a scaled measurement of the output power. For the purposes of the described embodiments, where the only relevant measurements needed to achieve constant power limiting will be near their peak values at rated power, and thus, easier to measure than small signals, this equation can produce accurate results over a practical range of 4:1 load impedance with a greater than 90% efficient switching amplifier.

Figure 4:
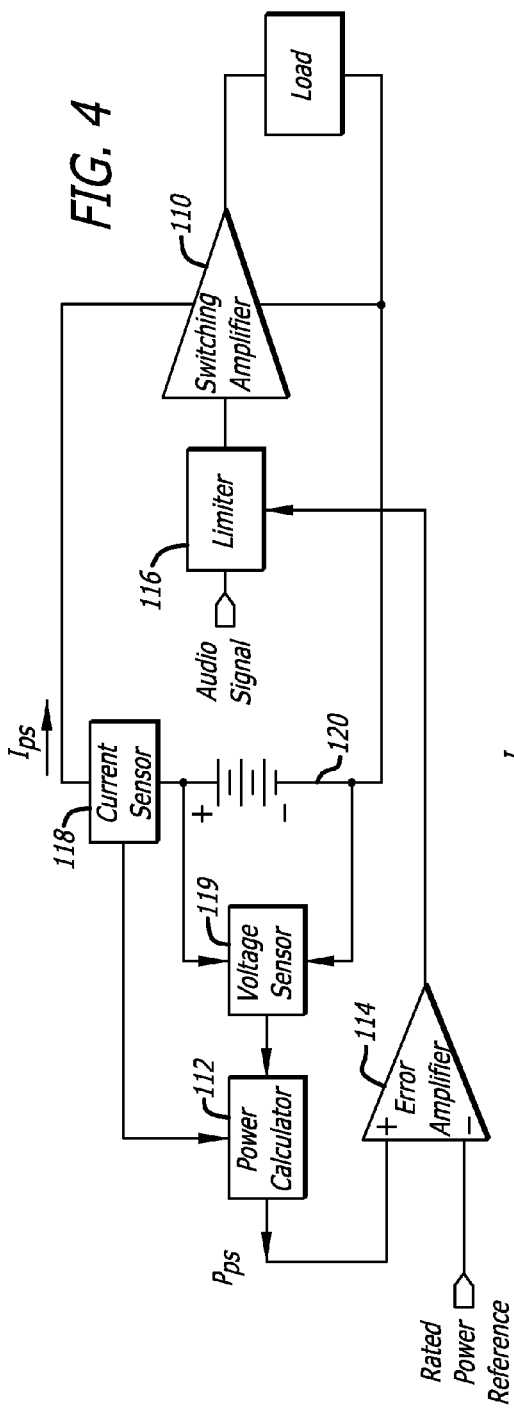
FIG. 4 depicts a diagram of one embodiment of a switching amplifier that includes a dynamic constant power feature.

Therefore, one embodiment of a switching amplifier 110 is shown in FIG. 4 that includes a power calculator 112 connected to an error amplifier 114 that is connected to a signal limiting circuit 116. There is also shown a current sensor 118 that is connected to the power calculator 112 and a voltage sensor 119 that is connected to the power calculator. The switching amplifier 110 in FIG. 4 can represent the two-wire Class BD amplifier 30 shown in FIG. 1 or the single wire Class BD amplifier 60 shown in FIG. 2. For ease of reference, in FIG. 4, a single high-power rail 120 is shown that represents the single grounded high-voltage power supply (Vrail) 34 of the two-wire Class BD amplifier 30, or in another embodiment, the high-power rail 120 represents the single floating high-voltage supply (Vrail) 64 of the single wire Class BD amplifier 60. Further, the current sensor 118 may represent resistor 48 or resistor 50 of the two-wire Class BD amplifier 30, or the current sensor 118 may represent resistor 84 of the single wire Class BD amplifier 60. The current sensor 118 may represent all ways described to measure the current of the power supply, including methods described that use circuits internal to the switching amplifiers. In yet another embodiment where the switching amplifier 110 of FIG. 4 represents the Class AD amplifier 90 of FIG. 3, the current sensor 118 represents a circuit that sums the two high-power voltage supply currents measured at resistors 102 and 104 of the Class AD amplifier. Further, when the switching amplifier 110 represents the Class AD amplifier 90, the voltage sensor 119 represents a circuit that sums the two high-power voltage supply voltages measured at +HV and −HV.

The switching amplifier 110 shown in FIG. 4 is capable of calculating an efficiency scaled measurement (k1*Pps) of the power supply power. In operation, the power calculator 112 receives the voltage power supply (Vps) across the high-voltage power supply (Vrail) of the amplifier from the voltage sensor 119 and multiplies this value to the current power supply (Ips) supplied to the power calculator by the current sensor 118. The error amplifier 114 then compares the calculated value taken by the power calculator 112 to a scaled reference representing rated power. An error signal is produced by the error amplifier 114 when the measurement from the power calculator 112 exceeds the rated power reference. This error signal triggers the signal limiting circuit 116 that effectively limits the output power to rated power at any load impedance that follows the equation, Pout=k1*Pps, with reasonable accuracy. Any impedance that follows this equation with reasonable accuracy can be defined as a rated impedance range. The value of the scaling factor k1 is generally equal to the amplifier efficiency at rated power, and may be the average efficiency measured over the rated impedance range. Since Vps is always a positive quantity, and Ips may be positive or negative, the power calculator 112 requires no more than a 2-quadrant multiplier.

The rated power reference can be calculated with the following equation:

$$\text{Rated Power Reference} = \text{Rated power}/k1$$

For example, using the above equation, if Rated Power=100 W, and the amplifier efficiency k1=0.87, then the Rated Power Reference would equal 115 W. The switching amplifier 110 will produce an error in the system, causing the signal to be limited, if the measured Pps is greater than 115 W. In this example, if Pps equals 115 W, then Pout equals (0.87) *(115 W) or 100 W. This calculation checks with the desired Rated Power.

Figure 5:
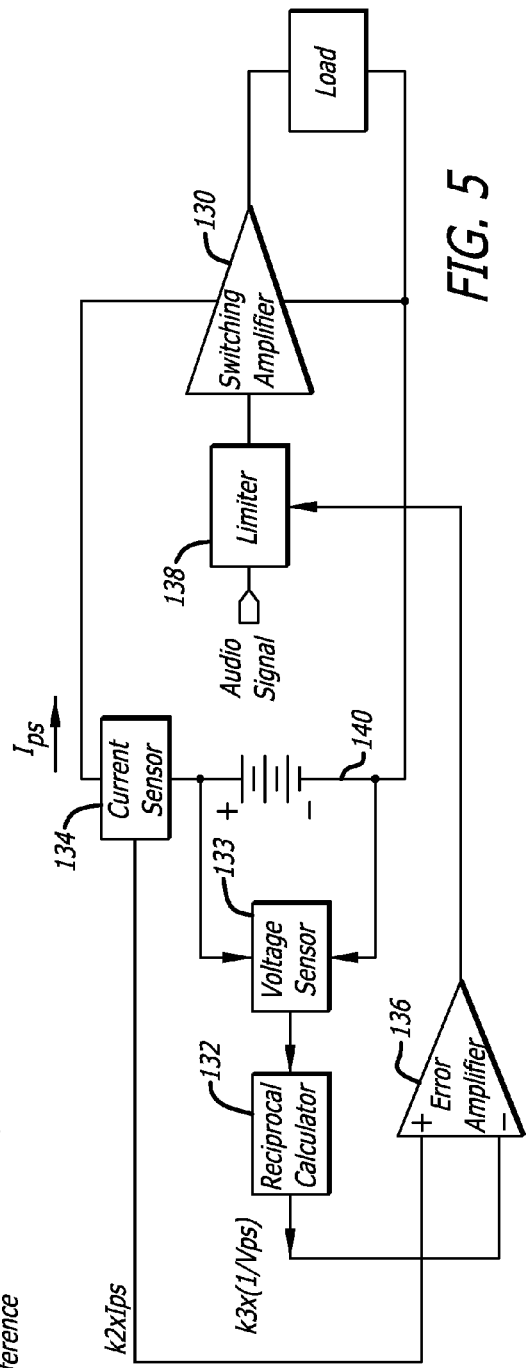
FIG. 5 depicts a diagram of another embodiment of a switching amplifier that includes a dynamic constant power feature.

Another embodiment of a switching amplifier 130 that is capable of calculating an efficiency scaled measurement (k1*Pps) of the power supply power is shown in FIG. 5. In this embodiment, instead of using the power calculator 112 that multiplies Vps and Ips, a reciprocal calculator 132 is used to scale a measurement of the power supply voltage (k3*(1/

Vps)). The power supply voltage of the high-power rail 140 is supplied to the reciprocal calculator 132 by a voltage sensor 133 that is connected to the high-power rail. Also, a current sensor 134 is used to scale a measurement of the current power supply (k2*Ips). These scaled measurements are sent to and compared at an error amplifier 136. The error amplifier 136 then compares these scaled measurements and an error signal is produced by the error amplifier when the scaled current measurement exceeds the scaled reciprocal voltage measurement. This error signal triggers a signal limiting circuit 138 connected to the error amplifier 136 and the switching amplifier 130 that effectively limits the output power to rated power at any load impedance that follows the equation, Pout=k1*Pps, with reasonable accuracy.

The switching amplifier 130 in FIG. 5 may represent the two-wire Class BD amplifier 30 of FIG. 1 or the single wire Class BD amplifier 60 of FIG. 2. For ease of reference, in FIG. 5, the single high-power rail 140 is shown that represents the single grounded high-voltage power supply (Vrail) 34 of the two-wire Class BD amplifier 30, or the high-power rail 140 represents the single floating high-voltage supply (Vrail) 64 of the "single wire" Class BD amplifier 60. Further, the current sensor 134 represents resistor 48 of the two-wire Class BD amplifier 30, or the current sensor 134 represents the resistor 84 of the single wire Class BD amplifier 60. The current sensor 134 represents all ways described to measure the current of the power supply. In yet another embodiment, the switching amplifier 130 of FIG. 5 may also represents the Class AD amplifier 90 of FIG. 3, and the current sensor 134 represents a circuit that sums the two high-power voltage supplies of the Class AD amplifier. Further, when the switching amplifier 130 represents the Class AD amplifier 90, the voltage sensor 133 represents a circuit that sums the two high-power voltage supply voltages measured at +HV and −HV.

These measurements are scaled to compensate for efficiency losses such that an error will be produced if:

$$k1*Vps*Ips > \text{Rated Power}$$

Expanding on this equation, the scaling can be chosen with the following method. A current scaling factor k2 is chosen so that:

$$k2 = Ips > \left(\frac{k2}{k1}\right) * \text{Rated power} * \frac{1}{Vps}$$

Scaling factor k3 can be solved using the following equation:

$$k3 = \left(\frac{k2}{k1}\right) * \text{Rated Power}$$

In one example, the following variables are used: Rated Power equals 250 W, current scaling factor k2 equals 0.1, and amplifier efficiency k1 equals 0.91. Using these numbers, k3 equals 27.5 and is derived using the following equation:

$$k3=(0.1/0.91)*250=27.5$$

For this example, an error will be produced that limits the output power if:

$$0.1*Ips > 27.5\left(\frac{1}{Vps}\right)$$

Therefore, if Vps equals 50V, the above equation solves for an allowed current of Ips that equals 5.5 A, Pps equals 50V*(5.5 A) or 275 W. To check this with the desired Rated Power, Pout equals 0.91*(275 W) or 250 W.

A similar circuit can be used with one of the switching amplifiers 30, 60 or 90 that measures output load power directly and limits the signal when a rated power reference is exceeded. However, a disadvantage of this implementation is that it requires a four-quadrant multiplier, while the above embodiment shown in FIG. 4 requires a two-quadrant multiplier, and no multiplier at all in the embodiment shown in FIG. 5.

In yet another embodiment, a similar circuit can also be used with one of the switching amplifiers 30, 60 or 90 that has a fixed or regulated high-voltage supply. In this embodiment, however, there would be no need to have a power calculator or a reciprocal calculator since the voltage is fixed at a known quantity. A voltage sensor is not needed to measure the voltage, and instead, a fixed reference can be substituted in the system. Referring now to FIG. 6, a switching amplifier 141 may represent the two-wire Class BD amplifier 30, the single wire Class BD amplifier 60, or the Class AD amplifier 90. For ease of reference, in FIG. 6, a single high-power rail 142 is shown that represents the single grounded high-voltage power supply (Vrail) 34 of the two-wire Class BD amplifier 30, or the high-power rail 140 represents the single floating high-voltage supply (Vrail) 64 of the single wire Class BD amplifier 60. Further, a current sensor 143 represents resistor 48 of the two-wire Class BD amplifier 30, or the current sensor 143 represents the resistor 84 of the single wire Class BD amplifier 60. The current sensor 143 represents all ways described to measure the current of the power supply. The switching amplifier 141 of FIG. 6 may also represents the Class AD amplifier 90 of FIG. 3, and the current sensor 134 represents a circuit that sums the current of the two high-power voltage supplies of the Class AD amplifier. The dynamic constant power device in FIG. 6 also includes an error amplifier 144 that is connected between the current sensor 143 and a signal limiting circuit 145.

In operation, the current sensor 143 may scale the current according to the fixed voltage of the system by amplifying the measured Ips with a gain equal to the fixed voltage value, and send the resulting value to the error amplifier 144. The error amplifier 144 then compares the scaled value from the current sensor 143 to a rated power reference. In one embodiment, the rated power reference can be scaled according to the fixed voltage instead of scaling the power supply current according to the fixed voltage. An error signal is produced by the error amplifier 144 when the measurement from the current sensor 143 exceeds the rated power reference. This error signal triggers the signal limiting circuit 145 that effectively limits the output power to rated power at any load impedance.

Referring to another embodiment shown in FIG. 7, a switching amplifier 146 may represent the two-wire Class BD amplifier 30, the single wire Class BD amplifier 60, or the Class AD amplifier 90. For ease of reference, in FIG. 7, a single high-power rail 147 is shown that represents the single grounded high-voltage power supply (Vrail) 34 of the two-wire Class BD amplifier 30, or the high-power rail 140 represents the single floating high-voltage supply (Vrail) 64 of the single wire Class BD amplifier 60. Further, a current sensor 148 represents resistor 48 of the two-wire Class BD amplifier 30, or the current sensor 143 represents the resistor 84 of the single wire Class BD amplifier 60. The current sensor 143 represents all ways described to measure the current of the power supply. The switching amplifier 148 of FIG. 7 may also represents the Class AD amplifier 90 of FIG. 3, and the current sensor 148 represents a circuit that sums the two high-power voltage supplies of the Class AD amplifier. The dynamic constant power device in FIG. 7 also includes an error amplifier 149 that is connected between the current sensor 148 and a signal limiting circuit 151.

In operation, the current sensor 148 is used to scale a measurement of the current power supply (k2*Ips). This scaled measurement is sent to and compared at the error amplifier 149 with a rail reciprocal reference. In this embodiment, the rail reciprocal reference represents a scaled value of the fixed voltage in the system that may be equal to k3*(1/Vps). The error amplifier 149 then compares the scaled measurement of the power supply current to the rail reciprocal reference, and an error signal is produced by the error amplifier when the scaled current measurement exceeds the scaled reciprocal reference. This error signal triggers the signal limiting circuit 151 connected to the error amplifier 149 and the switching amplifier 146 that effectively limits the output power to rated power at any load impedance.

Figure 8:
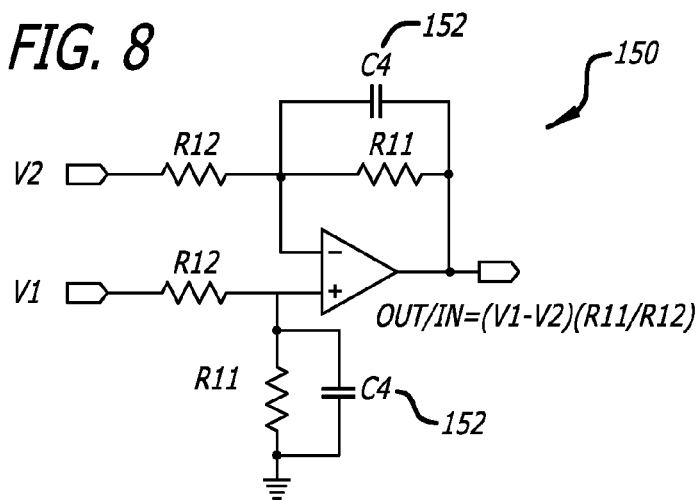
FIG. 8 depicts a differential amplifier used to measure the power supply current of the switching amplifier.
Figure 9:
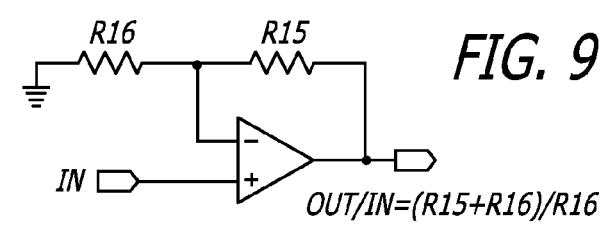
FIG. 9 depicts a single-ended amplifier used to measure the power supply current of the switching amplifier.
Figure 10:
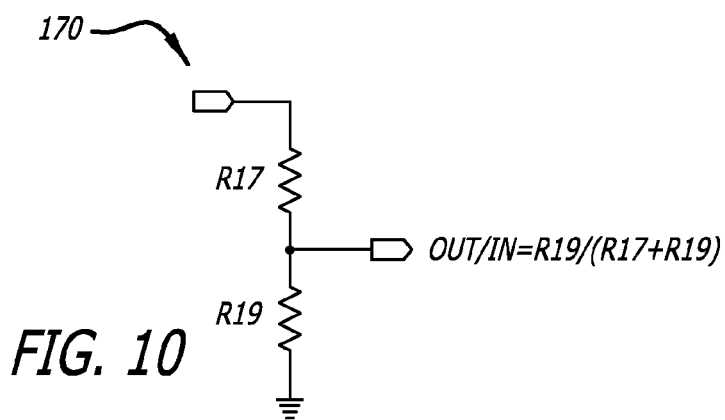
FIG. 10 depicts a resistor divider used to measure the power supply voltage of the switching amplifier.

Methods for measuring voltage power supply (Vps) and current power supply (Ips) in the two-wire Class BD amplifier 30 of FIG. 1 will now be described. A scaled measurement of Ips can be accomplished by measuring the voltage across low-impedance shunt or sense resistor 48 with a differential amplifier 150 that is shown in FIG. 8. Using the differential amplifier 150, a "Kelvin connection" can be made directly to the terminals of the sense resistor 48, which increases the accuracy of the measurement. Another method to measure Ips is to measure the voltage drop across ground-referenced sense resistor 50 with a single-ended amplifier 160 shown in FIG. 9. In either embodiment, the measured signal can be scaled by selecting the appropriate resistor values. The voltage signal measured across a sense resistor is typically very small and may benefit from amplification to improve the noise immunity of the circuit. The high-voltage supply (Vrail) can be measured directly at the positive terminal of DC supply Vrail, and can be scaled with a resistor divider 170, such as the one shown in FIG. 10.

Methods for measuring voltage power supply (Vps) and current power supply (Ips) in the single-wire BD amplifier 60 shown in FIG. 2 will now be described. A scaled measurement of Ips can be accomplished by measuring the voltage across sense resistor 84 with the differential amplifier 150 shown in FIG. 8. In this embodiment, it is preferred that the common-mode rejection of the circuit be exceptionally good to eliminate the high-voltage switching waveform from the measurement. If sense resistors 80 and 82 of amplifier 60 are installed in the amplifier, and the short connection 78 is eliminated, a scaled measurement of Ips can be made with the differential amplifier 150 when a non-inverting input V1 of the differential amplifier is connected to the non-grounded terminal of sense resistor 80, and an inverting input V2 of the differential amplifier is connected to the non-grounded terminal of sense resistor 82. Capacitors 152 of the differential amplifier 150 can be utilized to filter out switching ripple.

Another method to acquire a scaled measurement of current power supply (Ips) employs a chopper circuit 180 (FIG. 11) driven by the Trinary output voltage of the single-wire BD amplifier 60. The amplifier 60 must be connected with a single sense resistor 82 and shorting connection 78. In this embodiment, the sense resistor 80 is eliminated. The current Ips running through the power supply will also run through sense resistor 82 whenever MOSFETs 70a and 72b are on, or MOSFETs 72a and 70b are on. These two states always produce a non-zero output voltage of +Vrail or −Vrail at the Trinary PWM output terminal of the amplifier 60. During all other valid output states, the Trinary PWM output is zero and the current through sense resistor 82 is not equal to the power supply current Ips. In order to make an accurate scaled measurement of Ips, the chopper circuit 180 must be designed such that the Ips-scaled voltage at sense resistor 82 is measured only during times that the Trinary PWM output is non-zero. The chopper circuit measurement must zero during all other times.

Figure 11:
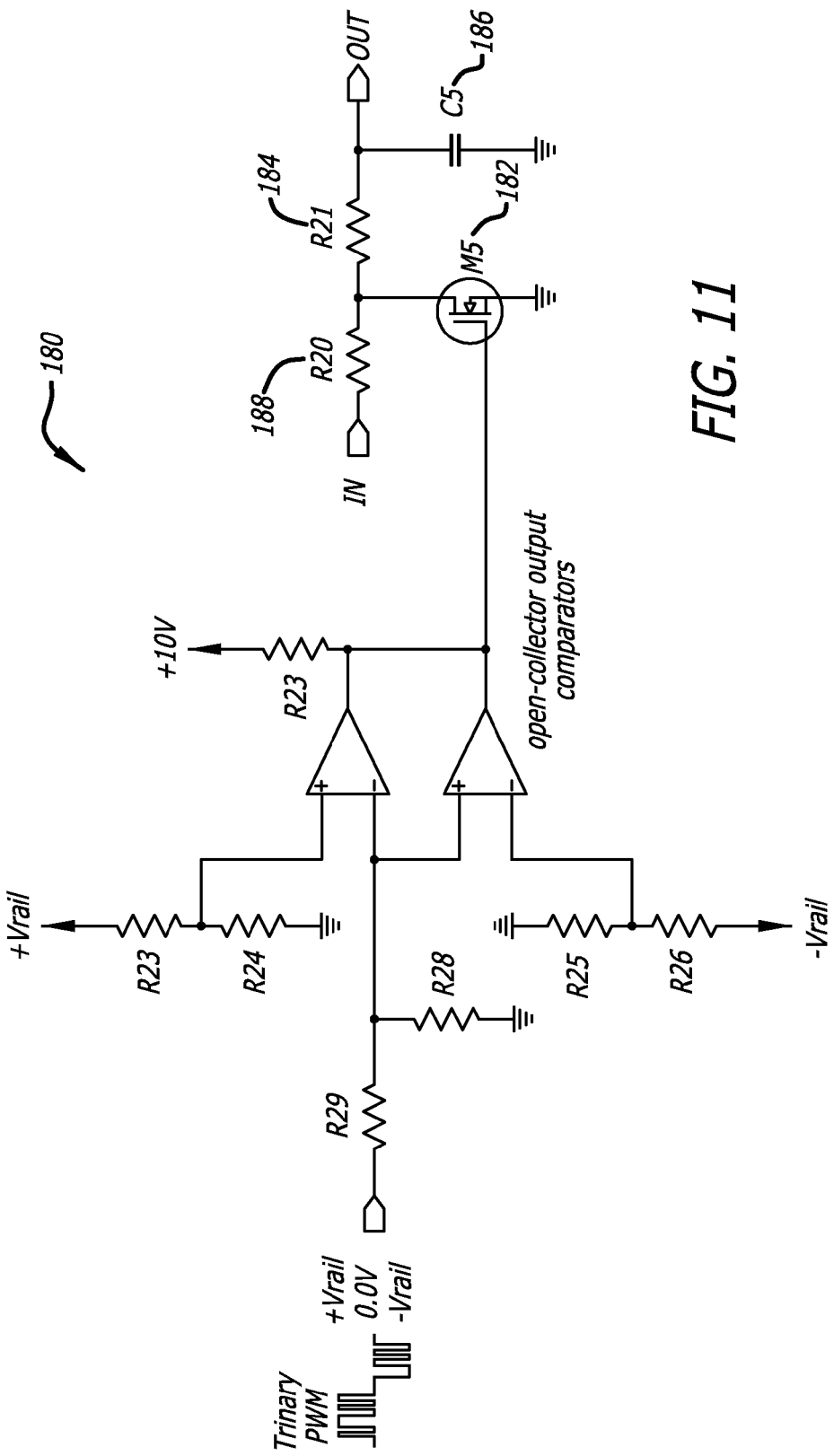
FIG. 11 depicts one embodiment of a chopper circuit used to acquire a scaled measurement of the power supply current of the single-wire Class BD amplifier.

Referring to FIG. 11, IN port of the chopper circuit 180 is connected to the non-grounded terminal of sense resistor 82 in the amplifier 60. The chopper circuit 180 includes a MOSFET 182 that functions as a chopper and produces nearly zero volts out when it is turned on by a high output state of the comparators, and outputs the voltage measured across sense resistor 82 of amplifier 60 when the comparators are low, and MOSFET 182 is off. Further, the chopper circuit 180 includes a resistor 184 and a capacitor 186 and together the resistor 184 and capacitor 186 form a low-pass filter to average out the chopped waveform.

As shown in FIG. 11, resistor 188 of the chopper circuit 180 can serve two functions. First, it can protect MOSFET 182 from excessive current, and second, it can prevent chopping action of MOSFET 182 from distorting the input signal at resistor 82 of amplifier 60. The integrity of this signal at resistor 82 may be important for other purposes such as current limiting or shorted output protection. The time constant of the low-pass filter is the measurement at resistor 184 multiplied by the measurement at capacitor 186 when the chopper MOSFET 182 is on. When the chopper MOSFET 182 is off, the time constant of the low-pass filter is the summed measurement of resistor 188 and resistor 184 multiplied by the measurement at capacitor 186. By using these types of calculations, the accuracy of the output signal will improve if the value of resistor 188 is less than the low-pass resistor 184.

Referring now to FIG. 12, another embodiment of a chopper circuit 190 is shown that is used to make a scaled measurement of current power supply (Ips) in the single-wire Class BD amplifier 60 employing a single sense resistor 82 as previously described. Chopper circuit 190 includes an NPN transistor 192 that acts as the chopper. The NPN transistor 194 turns the chopper off when the Trinary PWM output of amplifier 60 is high (+Vrail), and NPN transistor 191 of the chopper circuit 190 turns NPN transistor 192 off when the Trinary PWM output from the amplifier 60 is low (−Vrail). When the Trinary PWM output is zero, a pull-up resistor 196 of the chopper circuit 190 turns the NPN transistor 192 on. The chopper circuit 190 also includes resistors 198 and 200 and a capacitor 202. The resistors 198 and 200 and capacitor 202 have the same circuit connections and principles of operation as chopper circuit 180 (including resistors 184 and 188 and capacitor 186) shown in FIG. 11.

Now a method for measuring the voltage power supply (Vps) in the single-wire Class BD topology will be described using a peak hold circuit 210 of FIG. 13. In this topology, Vps equals the high-voltage supply (Vrail). By connecting the positive terminal of the floating DC power supply (Vrail) of amplifier 60 (FIG. 2) to the IN port of the peak hold circuit 210, the DC voltage will be rectified by diode 212 and stored in capacitor 214 when the Trinary PWM output of the amplifier 60 is in the high state (+Vrail). When the output is in the high state, MOSFETs 70a and 72b are on. With MOSFET 72b on, the negative terminal of Vrail is grounded through the low impedance sense resistor 82. This allows current to flow through the power supply and the grounded peak hold circuit, performing the desired measurement of Vps. Notably the peak hold circuit 210 will not make the Vps measurement unless there is signal present at the Trinary PWM output terminal of amplifier 60. A resistor 216 serves as a low-pass filter to prevent any overshoot spikes from overcharging capacitor 214 to a false measurement. Also, resistor 218 of the peak hold circuit 210 allows the OUT measurement to average the peak measurement over time and react properly to a decreasing Vps, rather than holding the highest peak voltage. The voltage drop across diode 212 represents a small error in the measurement. Since this direct high voltage measurement of Vps at the OUT port will typically exceed the voltage rating of successive circuitry, the measurement can be scaled down with the resistor divider circuit 170 of FIG. 10.

Figure 14:
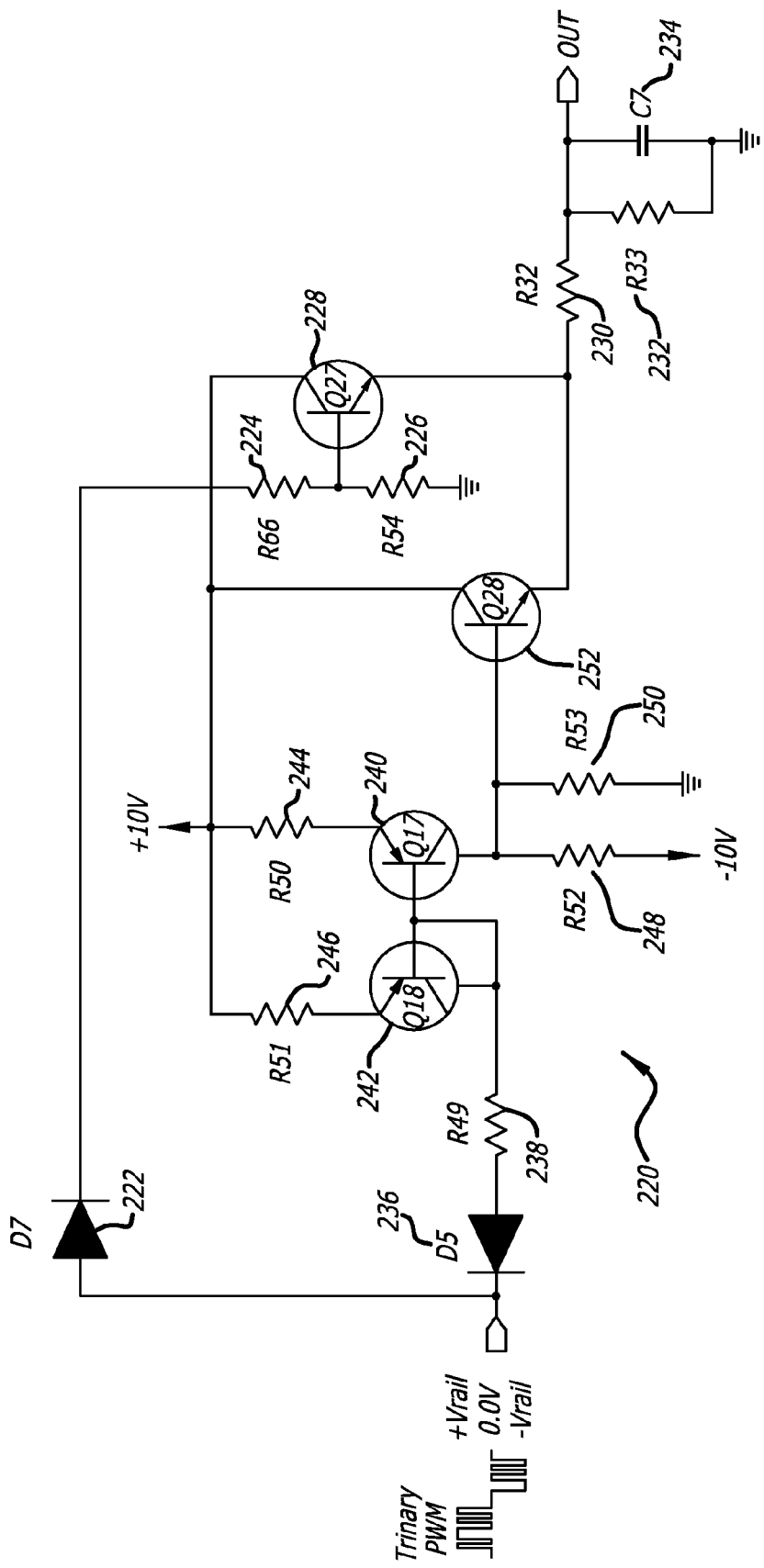
FIG. 14 depicts another embodiment of a peak hold circuit used to measure and scale the power supply voltage of the single-wire Class BD amplifier.

Another embodiment of a peak hold circuit 220 to measure the voltage power supply (Vps) is shown in FIG. 14. This circuit 220 rectifies and scales both the positive and negative states of the Trinary PWM output of the amplifier 60. When the Trinary PWM output is in the high state (+Vrail), MOSFETs 70a and 72b are on, shorting the negative terminal of Vrail to ground through low impedance sense resistor 82 and the positive terminal to the Trinary PWM output terminal. Therefore, in this high state, Vrail can be rectified through diode 222 of the circuit 220. Also, Vrail can be scaled down by resistors 224 and 226 of circuit 220 and buffered by voltage follower transistor 228. This will charge resistors 230 and 232 and capacitor 234 of the peak hold circuit 220 to the scaled Vps measurement. When the Trinary PWM output of amplifier 60 is in the low state (−Vrail), MOSFETs 72a and 70b are on, shorting the positive terminal of Vrail to ground through the short connection 78, the low impedance sense resistor 82, and the negative terminal to the Trinary PWM output terminal of amplifier 60. Therefore, in this low state, Vrail can be rectified through diode 236 of the circuit 220. Also, Vrail can be scaled down and inverted by current mirror circuit, which include resistor 238, NPN transistor 240, NPN transistor 242, resistor 244, and resistor 246. Vrail can also be DC-offset corrected and I-V converted by resistor 248 and 250, and buffered by voltage follower transistor 252. This charges resistors 230 and 232 and capacitor 234 of the peak hold circuit 220 to the scaled Vps measurement. Resistors 230 and 232 and capacitor 234 of the peak hold circuit 220 have the same circuit connections and principles of operation as the peak hold circuit 210 (resistors 216 and 218 and capacitor 214) shown in FIG. 13.

Now, methods will be described for measuring the voltage power supply (Vps) and current power supply (Ips) in the Class AD topology shown in FIG. 3. The two grounded high-voltage supplies of amplifier 90 will generally require two sensors, and a summing circuit to reduce the measurements to single scalars Vps and Ips. In the Class AD topology of FIG. 3, Vps should be a scaled measurement of the power supply voltage +HV minus −HV. Also, Ips should be a sum of I+HV plus I−HV. A scaled measurement of Vps can be made with the differential circuit 150 of FIG. 8, with +HV output terminal of amplifier 90 connected to the V1 non-inverting input terminal of the differential circuit, and −HV output terminal of amplifier 90 connected to the V2 inverting input terminal of the differential circuit. To measure Ips of the Class AD topology, the current waveforms, which are high-frequency PWM pulses, must also be level-shifted from high-voltage rails to ground.

Figure 15:
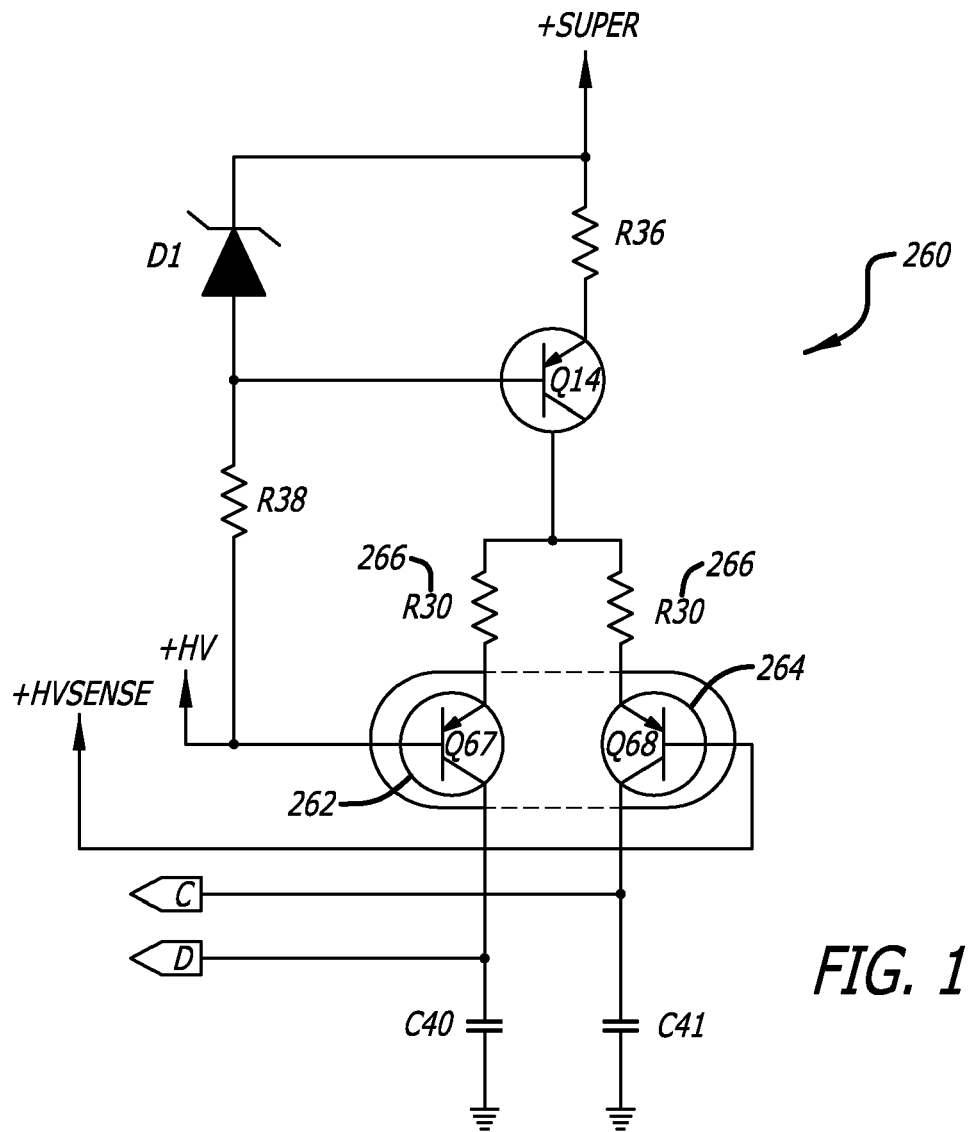
FIG. 15 depicts a high side current sense differential amplifier used to measure and scale the power supply current of the Class AD amplifier.
Figure 16:
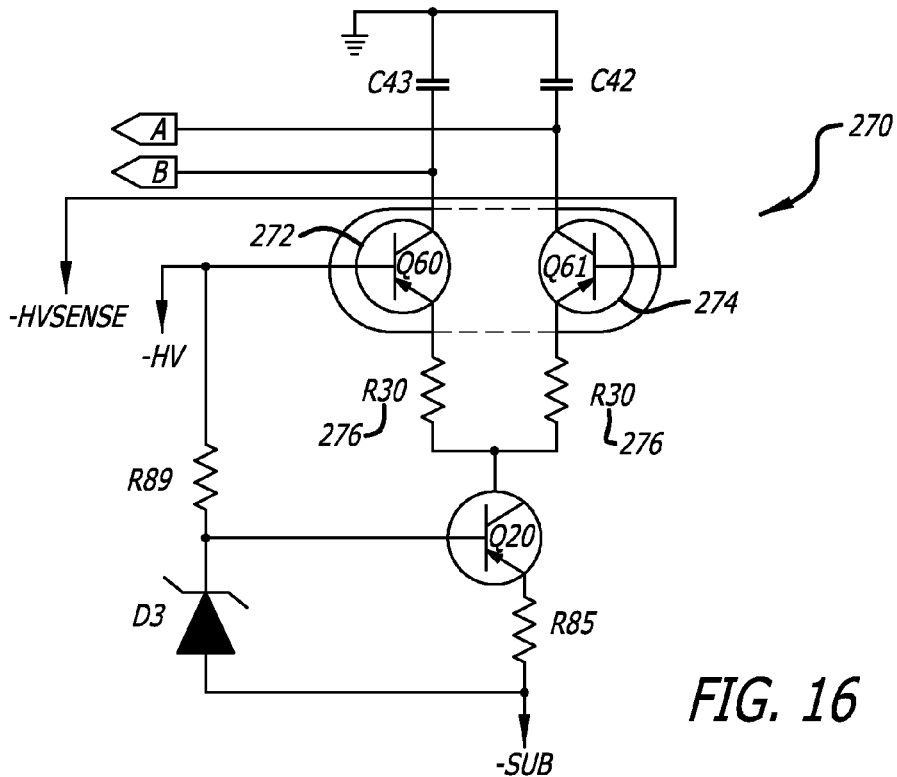
FIG. 16 depicts a low side current sense differential amplifier used to measure and scale the power supply current of the Class AD amplifier.
Figure 17:
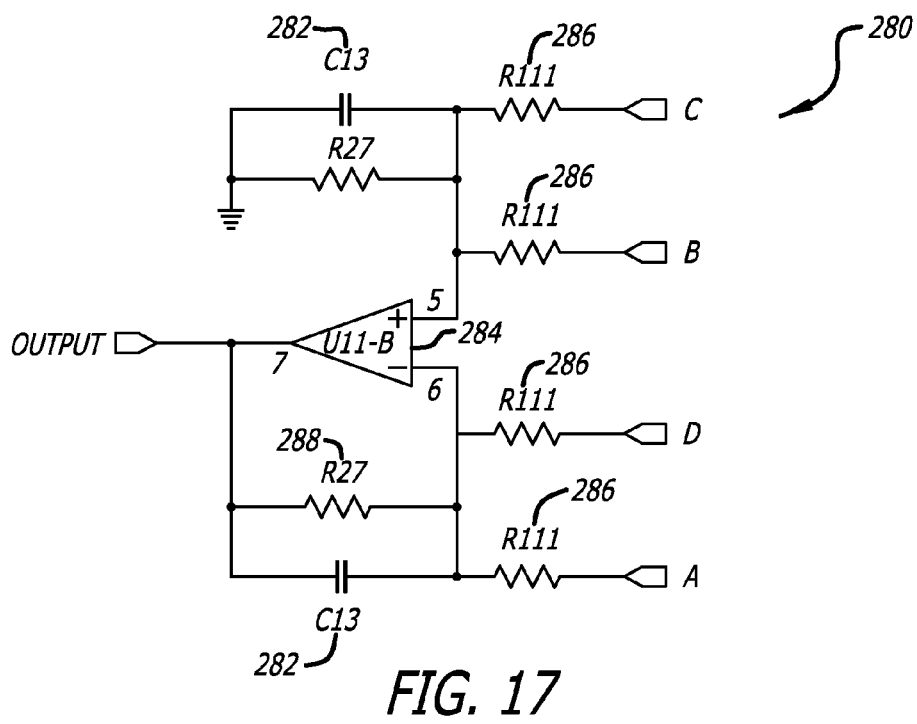
FIG. 17 depicts a differential summing amplifier used to measure and scale the power supply current of the Class AD amplifier.

The circuits shown in FIGS. 15-17 will make differential voltage measurements across the sense resistors of amplifier 90 carrying the power supply currents, convert them to differential currents, level-shift the currents to ground, and then scale, sum and convert the measurements to a single voltage that is proportional to the sum of the rail currents I+HV plus I−HV. A high side current sense differential amplifier 260 is shown in FIG. 15, and discrete differential inputs +HV and +HVSENSE of the differential amplifier 260 are connected across sense resistor 102 of amplifier 90, which carries the +HV power supply current I+HV. This differential voltage is converted to differential currents in the collectors of transistors 262 and 264. It is preferred that the conversion will be as linear as possible. This can be accomplished to an acceptable degree by increasing the value of the emitter resistors 266, depleting the transistor gain, and producing the following conversion equation:

$$ic(Q67) - ic(Q68) = \frac{+HV - (+HVSENSE)}{R30}$$

A low side current sense differential amplifier 270 is shown in FIG. 16 and works on the same principles as the high side current sense differential amplifier 260. The discrete differential inputs −HV and −HVSENSE of amplifier 270 are connected across the sense resistor 104 of amplifier 90, which carries the −HV power supply current I−HV. This differential voltage is converted to differential currents in the collectors of transistors 272 and 274. It is preferred that the conversion will be as linear as possible. This can be accomplished to an acceptable degree by increasing the value of the emitter resistors 276, depleting the transistor gain, and producing the following conversion equation:

$$ic(Q61) - ic(Q60) = \frac{-HVSENSE - (HV)}{R30}$$

Referring now to FIG. 17, a scaled Ips current amplifier 280 is shown. The amplifier 280 is a differential current-to-voltage converter and summer that will produce an output signal that is a scaled measurement of I+HV plus I−HV. The two low-pass capacitors 282 will average the high-frequency pulses and can reduce the slew-rate requirements of op-amp 284, such that a relatively low-cost audio component can be used. Typically 5V/us is sufficient. The four summing resistors 286 should have a value that is low enough to prevent saturation of the differential transistors. The two gain resistors 288 should be selected such that the highest expected Ips will not exceed the output voltage range of the op-amp 284 according to the following equation:

$$OUT\ PUT = (+HV - (+HVSENSE)) + (-HVSENSE - (-HV)) * \frac{R27}{R30}$$

Now if a common value of sense resistor is selected such that resistor 102 equals resistor 104, which equals Rsense, the scaling of Ips can be reduced to:

$$OUT\ PUT = Ips * Rsense * \frac{R27}{R30}$$

Figure 18:
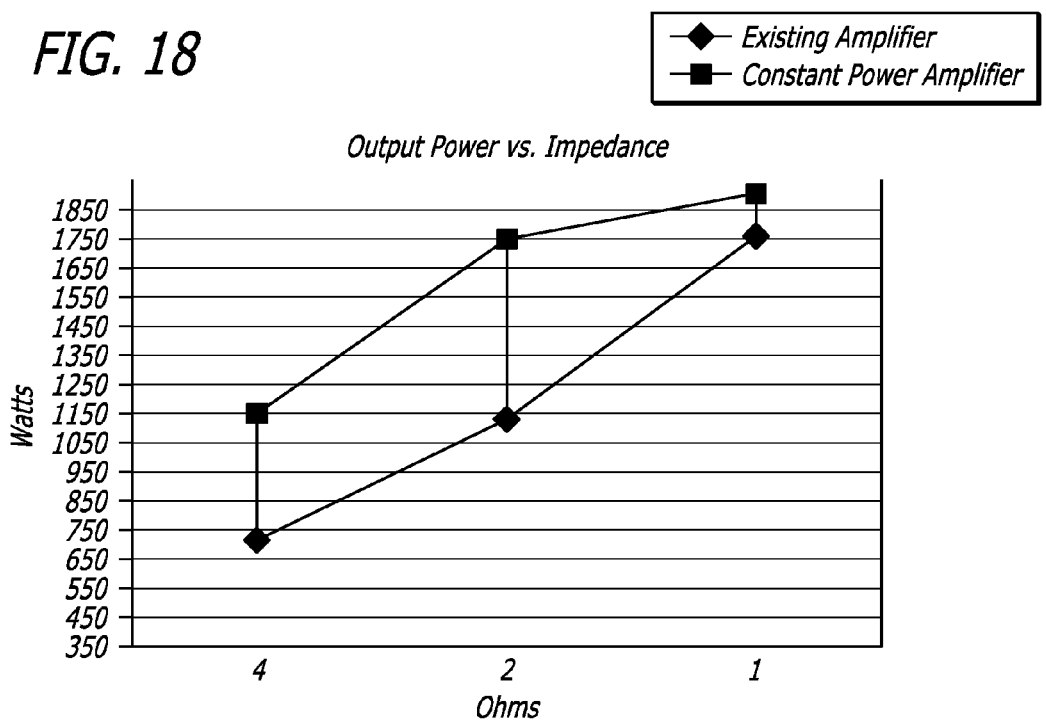
FIG. 18 depicts a graph showing the output power gained using a constant power amplifier over an existing amplifier.
Figure 19A:
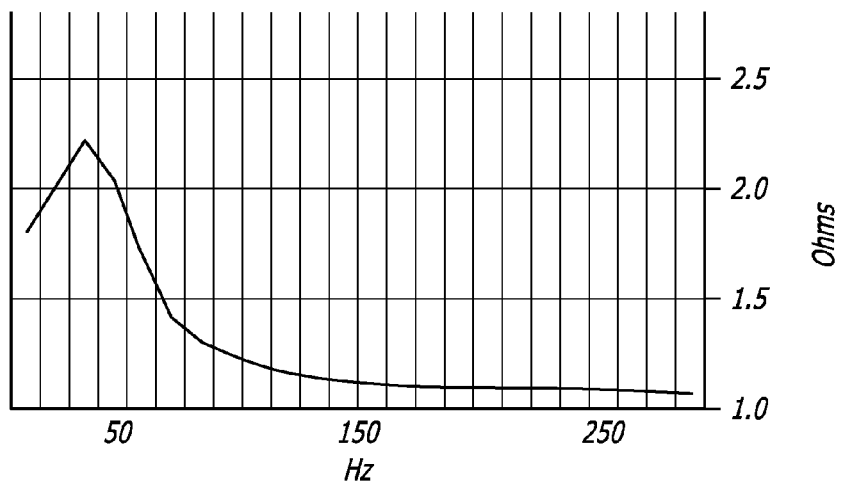
FIG. 19A depicts a graph showing an impedance rise at 40-50 HZ, which creates a problem at a subwoofer sweet spot.
Figure 19B:
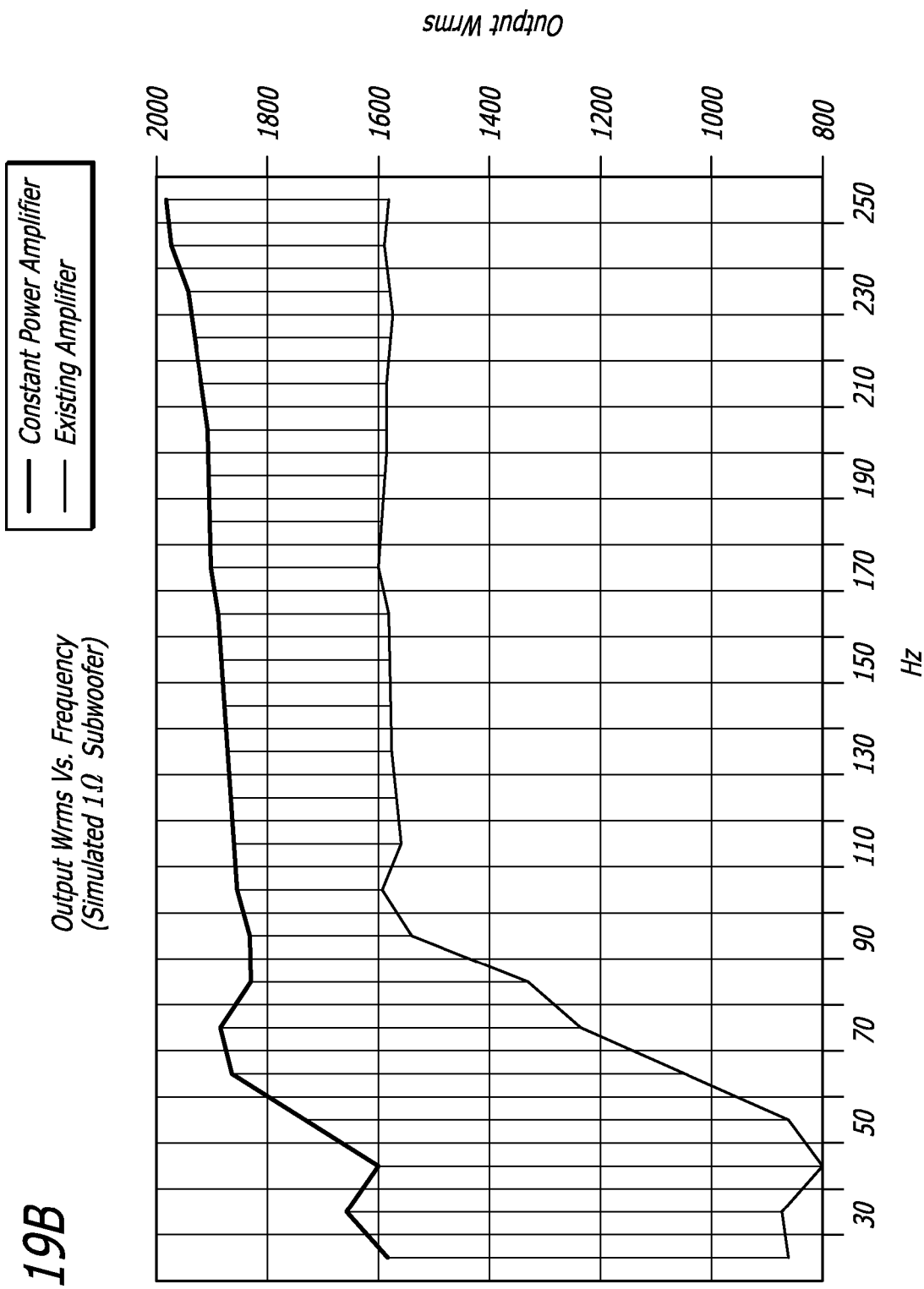
FIG. 19B depicts a graph showing the output power gained using a constant power amplifier over an existing amplifier that solves the subwoofer sweet spot problem depicted in FIG. 19A.
Figure 19C:
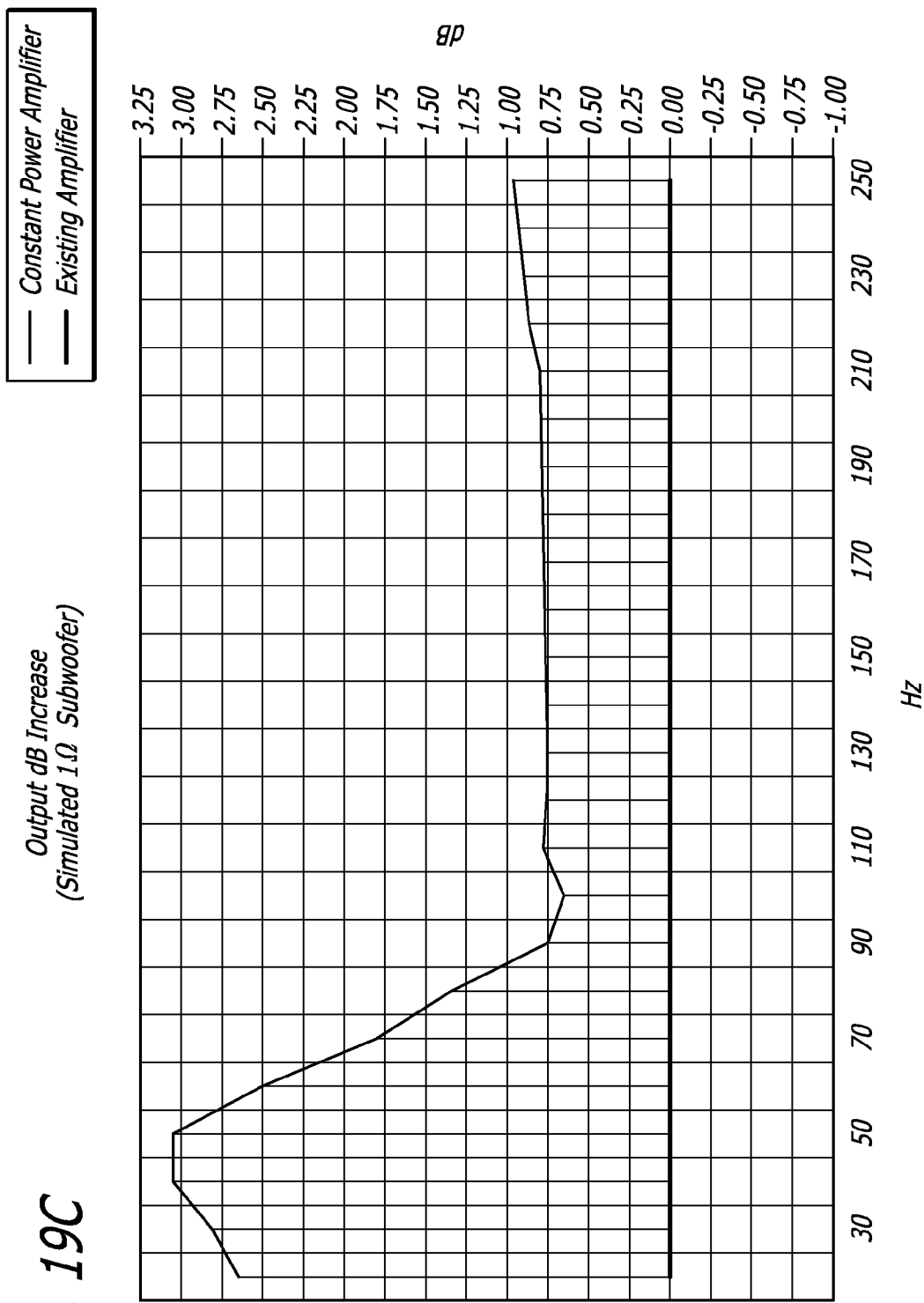
FIG. 19C depicts a graph showing the output decibels (dB) gained using a constant power amplifier.
Figure 19D:
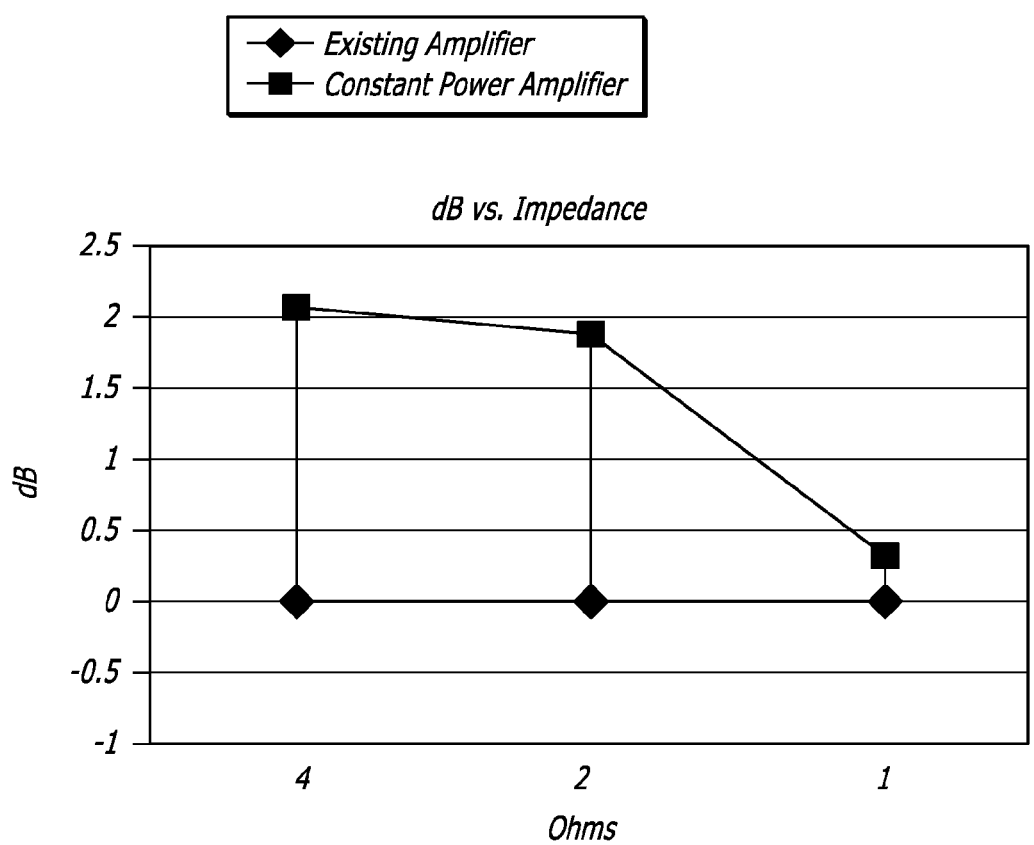
FIG. 19D depicts a graph showing the decibel value (dB) from four ohms to one ohm using a constant power amplifier.

Referring now to FIGS. 18-19D, these figures depict graphs based on measurements taken during experiments that compared a T1500-lbd single wire Class BD amplifier including the dynamic constant power enhancement ("constant power amplifier") to an existing T1500-lbd single wire Class BD amplifier without the dynamic constant power enhancement ("existing amplifier"). As shown in FIG. 18, the constant power amplifier outperformed the existing amplifier. Specifically, the amount of output power gained using the constant power amplifier is shown from four ohms to one ohm. The constant power amplifier showed an increase of 608 watts over the existing amplifier at two ohms.

The constant power amplifier also improves power or audio/sonic output at the subwoofer sweet spot of 40-50 Hz where the speaker impedance rise creates a corresponding hole that is the decline in power and sonic output. This is because the constant power amplifier is dynamically variable as music changes driver's impedance based on the constant power amplifier managing input power to the input signal amplitude. Therefore, the user of the constant power amplifier receives more power or SPL/dB at the sub sweet spot. The impedance rise at 40-50 Hz is shown in FIG. 19A. In FIG. 19B, the output power of the constant power amplifier is dramatically greater than output power of the existing amplifier at 40-50 Hz. Further, FIG. 19C shows that the constant power amplifier is twice as loud (+3 dB) at frequencies between 40-50 Hz. As shown in FIG. 19D, the decibel value (dB) from four ohms to one ohm is greater using the constant power amplifier compared to the existing amplifier.

The various embodiments described above are provided by way of illustration only and should not be construed to limit the claimed invention. Those skilled in the art will readily recognize various modifications and changes that may be made to the claimed invention without following the example embodiments and applications illustrated and described herein, and without departing from the true spirit and scope of the claimed invention, which is set forth in the following claims.

What is claimed is:

1. An amplifier device, comprising:
   a switching amplifier including an input for receiving an audio input signal and an output to a load, and the switching amplifier including a high voltage supply rail;
   a voltage sensor circuit connected to the high voltage supply rail and the voltage sensor circuit measures the power supply voltage of the switching amplifier;
   a current sensor circuit connected to the high voltage supply rail and the current sensor circuit measures the power supply current of the switching amplifier;
   an error amplifier connected to the switching amplifier receives a value based on the measurements taken by the voltage sensor and current sensor and produces an error signal when a predetermined power limit is exceeded; and
   a signal limiting circuit connected to the error amplifier and the switching amplifier, and the signal limiting circuit limits an output power to rated power at any rated load impedance when the error amplifier produces the error signal;
   wherein the amplifier device is capable of automatically limiting output power at rated power into all rated load impedances, and dynamically reacting to the frequency-dependant impedance of a typical audio system.

2. The device of claim 1, further comprising a power calculator connected between the error amplifier and the voltage and current sensor circuits, the power calculator multiplies the power supply voltage and power supply current together to calculate a scaled value of a power supply power.

3. The device of claim 2, wherein the error amplifier compares the value of the power supply power supplied by the power calculator to a scaled reference representing a rated power and the error amplifier produces the error signal when the value of the power supply power exceeds the scaled reference representing the rated power.

4. The device of claim 1, further comprising a reciprocal calculator connected between the error amplifier and the voltage current sensor, and the reciprocal calculator produces a scaled reciprocal value of the power supply voltage.

5. The device of claim 4, wherein the current sensor circuit produces a scaled value of the power supply current and the current sensor circuit is connected directly to the error amplifier.

6. The device of claim 5, wherein the error amplifier compares the scaled reciprocal value of the power supply voltage from the reciprocal calculator to the scaled value of the power supply current from the current sensor circuit, and the error amplifier produces the error signal when the scaled value of the power supply current exceeds the scaled value of the power supply voltage.

7. The device of claim 1, wherein the switching amplifier is a two-wire Class BD amplifier, a single-wire Class BD amplifier or a Class AD amplifier.

8. The device of claim 1, wherein the current sensor circuit is a differential amplifier that measures the voltage across a low-impedance sense resistor of the switching amplifier.

9. The device of claim 1, wherein the current sensor circuit is a single-ended amplifier that measures a voltage drop across a ground-referenced sense resistor of the switching amplifier.

10. The device of claim 1, wherein the voltage sensor circuit is a resistor divider that measures the voltage directly at a positive terminal of the high voltage supply rail.

11. The device of claim 1, wherein the current sensor circuit is a chopper circuit that measures the voltage across a sense resistor of the switching amplifier.

12. The device of claim 11, wherein the switching amplifier is a single wire Class BD amplifier having a trinary output voltage that drives the chopper circuit.

13. The device of claim 1, wherein the voltage sensor circuit is a peak hold circuit that measures the voltage of the high voltage supply rail.

14. The device of claim 1, wherein the switching amplifier is a Class AD amplifier having a first high voltage supply rail connected to a first sense resistor and a second high voltage supply rail connected to a second sense resistor, and the current sense circuit sums the currents at the first and second high voltage supply rails measured at the first and second sense resistors.

15. The device of claim 14, wherein the voltage sense circuit sums the power supply voltage of the first and second high voltage supply rails.

16. A method for delivering rated power into all rated load impedances of a switching amplifier, comprising:
   measuring a power supply voltage of the switching amplifier with a voltage sensor circuit connected to a high voltage supply rail of the switching amplifier;
   measuring a power supply current of the switching amplifier with a current sensor circuit connected to the high voltage supply rail of the switching amplifier;
   calculating a value of a power supply power with a power calculator connected between an error amplifier and the voltage and current sensor circuits by multiplying the power supply voltage and power supply current together;
   comparing the value of the power supply power to a scaled reference representing a rated power with the error amplifier connected to the switching amplifier and the power calculator;

producing an error signal from the error amplifier when the value of the power supply power exceeds the scaled reference representing the rated power; and limiting an output power of the switching amplifier to a rated power at any rated load impedance with a signal limiting circuit connected to the switching amplifier and the error amplifier when the error amplifier produces the error signal.

17. The method of claim 16, wherein automatically limiting output power of the switching amplifier at rated power into all rated load impedances, and dynamically reacting to the frequency-dependant impedance of a typical audio system.

18. The method of claim 16, wherein the switching amplifier is a two-wire Class BD amplifier, a single-wire Class BD amplifier or a Class AD amplifier.

19. The method of claim 16, wherein measuring the power supply current with the current sensor circuit, the current sensor circuit is a differential amplifier that measures the voltage across a low-impedance sense resistor of the switching amplifier.

20. The method of claim 16, wherein measuring the power supply current with the current sensor circuit, the current sensor circuit is a single-ended amplifier that measures a voltage drop across a ground-referenced sense resistor of the switching amplifier.

21. The method of claim 16, wherein measuring the power supply voltage with the voltage sensor circuit, the voltage sensor circuit is a resistor divider that measures the voltage directly at a positive terminal of the high voltage supply rail.

22. The method of claim 16, wherein measuring the power supply current with the current sensor circuit, the current sensor circuit is a chopper circuit that measures the voltage across a sense resistor of the switching amplifier.

23. The method of claim 22, wherein the switching amplifier is a single wire Class BD amplifier having a trinary output voltage that drives the chopper circuit.

24. The method of claim 16, wherein measuring the power supply voltage with the voltage sensor circuit, the voltage sensor circuit is a peak hold circuit that measures the voltage of the high voltage supply rail.

25. The method of claim 16, wherein measuring the power supply current with the current sensor circuit including summing the currents at first and second high voltage supply rails measured at first and second sense resistors of a Class AD switching amplifier having the first high voltage supply rail connected to a first sense resistor and the second high voltage supply rail connected to a second sense resistor.

26. The method of claim 25, wherein measuring the power supply voltage with the voltage sensor circuit including summing the power supply voltage of the first and second high voltage supply rails.

27. A method for delivering rated power into all rated load impedances of a switching amplifier, comprising:

measuring a power supply voltage of the switching amplifier with a voltage sensor circuit connected to a high voltage supply rail of the switching amplifier;

producing a scaled reciprocal value of the power supply voltage with a reciprocal calculator connected to the voltage sensor circuit;

measuring a power supply current of the switching amplifier with a current sensor circuit connected to the high voltage supply rail of the switching amplifier and producing a scaled value of the power supply current with the current sensor circuit;

comparing the scaled reciprocal value of the power supply voltage from the reciprocal calculator to the scaled value of the power supply current from the current sensor circuit with an error amplifier, the error amplifier being connected to the reciprocal calculator and current sensor;

producing an error signal from the error amplifier when scaled value of the power supply current exceeds the scaled reciprocal value of the power supply voltage; and limiting an output power of the switching amplifier to a rated power at any rated load impedance with a signal limiting circuit connected to the switching amplifier and the error amplifier when the error amplifier produces the error signal.

28. The method of claim 27, wherein automatically limiting output power of the switching amplifier at rated power into all rated load impedances, and dynamically reacting to the frequency-dependant impedance of a typical audio system.

29. The method of claim 27, wherein the switching amplifier is a two-wire Class BD amplifier, a single-wire Class BD amplifier or a Class AD amplifier.

30. The method of claim 27, wherein measuring the power supply current with the current sensor circuit, the current sensor circuit is a differential amplifier that measures the voltage across a low-impedance sense resistor of the switching amplifier.

31. The method of claim 27, wherein measuring the power supply current with the current sensor circuit, the current sensor circuit is a single-ended amplifier that measures a voltage drop across a ground-referenced sense resistor of the switching amplifier.

32. The method of claim 27, wherein measuring the power supply voltage with the voltage sensor circuit, the voltage sensor circuit is a resistor divider that measures the voltage directly at a positive terminal of the high voltage supply rail.

33. The method of claim 27, wherein measuring the power supply current with the current sensor circuit, the current sensor circuit is a chopper circuit that measures the voltage across a sense resistor of the switching amplifier.

34. The method of claim 33, wherein the switching amplifier is a single wire Class BD amplifier having a trinary output voltage that drives the chopper circuit.

35. The method of claim 27, wherein measuring the power supply voltage with the voltage sensor circuit, the voltage sensor circuit is a peak hold circuit that measures the voltage of the high voltage supply rail.

36. The method of claim 27, wherein measuring the power supply current with the current sensor circuit including summing the currents at first and second high voltage supply rails measured at first and second sense resistors of a Class AD switching amplifier having the first high voltage supply rail connected to a first sense resistor and the second high voltage supply rail connected to a second sense resistor.

37. The method of claim 36, wherein measuring the power supply voltage with the voltage sensor circuit including summing the power supply voltage of the first and second high voltage supply rails.

38. An amplifier device, comprising:

a switching amplifier including an input for receiving an audio input signal and an output to a load, and the switching amplifier including a regulated high-voltage supply rail;

a current sensor circuit connected to the regulated high-voltage supply rail and the current sensor circuit measures the power supply current of the switching amplifier;

an error amplifier connected to the switching amplifier receives a value based on the measurement taken by the current sensor and produces an error signal when a predetermined power limit is exceeded; and a signal limiting circuit connected to the error amplifier and the switching amplifier, and the signal limiting circuit limits the output power to rated power at any rated load impedance when the error amplifier produces the error signal;

wherein the amplifier device is capable of automatically limiting output power at rated power into all rated load impedances, and dynamically reacting to the frequency-dependant impedance of a typical audio system.

39. The device of claim 38, wherein the error amplifier compares the value based on the measurement taken by the current sensor to a rated power reference and the error amplifier produces the error signal when the value based on the measurement taken by the current sensor exceeds the scaled reference representing the rated power.

40. The device of claim 38, wherein the current sensor measures and scales the power supply current of the switching amplifier.

41. The device of claim 40, wherein the error amplifier compares the scaled value of the power supply current from the current sensor to a rail reciprocal reference and the error amplifier produces the error signal when the scaled value of the power supply current exceeds the rail reciprocal reference.

* * * * *

UNITED STATES PATENT AND TRADEMARK OFFICE
CERTIFICATE OF CORRECTION

Page 1 of 1

| | |
|---|---|
| PATENT NO. | : 7,994,857 B2 |
| APPLICATION NO. | : 12/645996 |
| DATED | : August 9, 2011 |
| INVENTOR(S) | : Mark D. Albers et al. |

It is certified that error appears in the above-identified patent and that said Letters Patent is hereby corrected as shown below:

Column 9
In line 48, replace "=" with --*--

Column 10
In line 38, replace "represents" with --represent--

Column 15
In line 22, replace "(+3 dB)" with --(+3dB)--

Signed and Sealed this
First Day of November, 2011

David J. Kappos
*Director of the United States Patent and Trademark Office*